United States Patent
Chen et al.

(10) Patent No.: US 11,239,838 B2
(45) Date of Patent: Feb. 1, 2022

(54) DRIVING DEVICE AND METHOD OF POWER DEVICE

(71) Applicant: LEN Technology Limited, Wuxi (CN)

(72) Inventors: Jingquan Chen, San Jose, CA (US); Chuan Ni, Plano, TX (US); Wei Lu, Shanghai (CN)

(73) Assignee: LEN Technology Limited, Wuxi (CN)

(*) Notice: Subject to any disclaimer, the term of this patent is extended or adjusted under 35 U.S.C. 154(b) by 0 days.

(21) Appl. No.: 16/865,137

(22) Filed: May 1, 2020

(65) Prior Publication Data
US 2021/0344335 A1 Nov. 4, 2021

(51) Int. Cl.
*H03K 17/082* (2006.01)
*H02H 1/00* (2006.01)
*H02H 9/00* (2006.01)

(52) U.S. Cl.
CPC ....... *H03K 17/0828* (2013.01); *H02H 1/0007* (2013.01); *H02H 9/001* (2013.01)

(58) Field of Classification Search
CPC ......... H03K 17/08–0828; H02H 3/025; H02H 9/001; H02H 3/08; H02H 3/093
See application file for complete search history.

(56) References Cited

U.S. PATENT DOCUMENTS

| | | | | |
|---|---|---|---|---|
| 2004/0201935 A1* | 10/2004 | Yamamoto | ......... | H03K 17/0828 361/93.1 |
| 2004/0252432 A1* | 12/2004 | Sasaki | ................ | B60W 20/00 361/91.1 |
| 2012/0013370 A1* | 1/2012 | Mori | ................ | H03K 17/0828 327/109 |

* cited by examiner

*Primary Examiner* — Jared Fureman
*Assistant Examiner* — Christopher J Clark
(74) *Attorney, Agent, or Firm* — Seed IP Law Group LLP (57) ABSTRACT

This application discloses a driving device for a power device. It includes a detection module, coupled to the power device, configured to detect the overcurrent status of the power device; a drive module, respectively coupled to the detection module and the power device, configured to regulate the power device according to the detection result of the detection module; wherein, when the detection result is that the power device is in the first overcurrent state, the drive module is configured to cause the power device to enter the first protection mode that is softly turned off and does not respond to the system switching signal; when the detection result is that the power device is in the second overcurrent state, the drive module is configured to cause the power device to enter a second protection mode that is softly turned off but responds to a system switching signal; wherein the overcurrent degree in the first overcurrent state is higher than that of the second overcurrent state. This application also provides a corresponding power device driving method and electrical equipment.

19 Claims, 7 Drawing Sheets

DRIVING DEVICE AND METHOD OF POWER DEVICE

BACKGROUND

Technical Field

The present application belongs to the field of electrical control, and in particular relates to a driving device and method suitable for power devices.

Description of the Related Art

In recent years, power devices such as insulated gate bipolar transistors (IGBT) and SiC power devices have been widely used in motor drive, lighting circuit, frequency converter, traction drive and other fields. However, in practical applications, the load short circuit often occurs. In the case of a load short circuit, the IGBT or SiC conduction current will be exceptionally large. If the power device is not turned off in time, it will cause the device to overheat and eventually cause the device to be damaged.

BRIEF SUMMARY

The present application provides a power device driving apparatus including a detection module, coupled with a power device, and configured to detect the state of the power device; a drive module, coupled to the detection module and the power device, respectively, and configured to adjust the power device according to the detection result of the detection module. In response to the detection result indicates that the power device is in the first overcurrent state, the drive module operates to control the power device to be in the first protection mode, under which the power device is turned off softly and does not respond to the system switching signal. In response to the detection result indicates that the power device is in the second overcurrent state, the drive module operates to control the power device to enter a second protection mode, under which the power device is turned off softly, but responds to the system switching signal. The degree of overcurrent in the first overcurrent state is higher than that in the second overcurrent state.

In some embodiments, the driving device further includes a switch signal shielding module, respectively coupled with the detection module and the driving module, and configured to, when the power device is in the first overcurrent state, shield the system switching signal from the drive module, according to the detection result of the detection module.

The present application also provides a power device driving apparatus, including a detection module, coupled with the power device, and configured to detect the state of the power device; a drive module, respectively coupled to the detection module and the power device, and configured to regulate the power device based on a detection result of the detection module. In response to that the detection result indicates that the power device is in the first overcurrent state, the drive module operates to control the power device to enter the first protection mode, under which the power device is softly shut down without responding to the system switching signal; when the detection result indicates that the power device is in the second overcurrent state, the detection module continues to detect the state of the power device within a first determined time period, e.g., a predetermined, experimentally determined or dynamically determined time period; during the first determined time period, when the power device reaches the first overcurrent state, the drive module is configured to enter the first protection mode; if the power device remains in the second overcurrent state during the first determined time period, the drive module is configured to enter the second protection mode when the first determined time period ends; wherein the current in the first overcurrent state is higher than the current in the second overcurrent state.

In some embodiments, the driving device further includes a switching signal shielding module, coupled with the detection module and the driving module, configured to shield the system switching signal when the power device is determined to be in the first overcurrent state based on the results from the detection module.

In some embodiments, the detection module includes a first comparator. A first input terminal of the first comparator is configured to receive the first threshold, a second input terminal of the first comparator is configured to receive a state flag signal of the power device, and its output terminal is coupled to the driving module providing a first state flag. The detection module also includes a second comparator. A first input terminal of the second comparator is configured to receive a second threshold, and a second input terminal of the second comparator is configured to receive the state flag signal. The first threshold corresponds to a first overcurrent state value, the second threshold corresponds to a second overcurrent state value and the first threshold is greater than the second threshold. The detection module also includes a delay unit, the first input terminal and the second input terminal of which are respectively coupled to the output of the first comparator and the second comparator, configured to generate the first determined time period, and to generate the second state flag signal based on the results from the first comparator and the second comparator within or at the end of the first determined time period. The first or second state flag signal indicates whether the power device is in the first or second overcurrent state.

In some embodiments, the delay unit includes a timer, a NOT gate and an AND gate. The timer has an input terminal coupled to the output terminal of the second comparator, and is configured to start when the output of the second comparator is asserted, and output an asserted signal when the timer expires. The NOT gate has an input coupled to the output of the first comparator. The AND gate has a first input coupled to the output of the NOT gate, a second input coupled to the output of the timer, and a third input coupled to the output of the second comparator. The output of the AND gate is coupled to the drive module to provide the second state flag signal to the drive module Flag.

In some embodiments, the switch signal shielding module includes a fault detector configured to block the system switch signal to the drive module when receiving the first flag status, and/or reporting the error to the system host.

In some embodiments, the driving apparatus further includes an adjustment module coupled between the power device and the detection module to generate the state flag signals based on the output of the power device.

The present application also provides a driving method for a power device, including detecting a power device overcurrent status; when the power device current is greater than or equal to a first threshold, the power device is put into a first protection mode, wherein the first threshold corresponds to the first overcurrent state; when the power device current is greater than or equal to the second threshold and less than the first threshold, the power device is put into the second protection mode. The second threshold corresponds to a second overcurrent state; wherein the first threshold is higher than the second threshold.

In some embodiments, in the first and second protection modes, the power device is in a soft off state, and in the first protection mode, the power device does not respond to a system switching signal.

The present application also provides a driving method for a power device, including detecting a power device overcurrent status; when the power device current is greater than or equal to a first threshold, the power device is put into a first protection mode, where the first threshold corresponds to the first overcurrent state; when the power device current is greater than or equal to the second threshold and less than the first threshold, the power device continues to be operated within a first determined time period; during the first determined time period, if the power device current is greater than or equal to the first threshold, then the power device is put into the first protection mode; at the end of the first determined time period, if the power device current is greater than or equal to the second threshold and is smaller than the first threshold, then the power device is put into a second protection mode. The second threshold corresponds to a second overcurrent state. The first threshold is higher than the second threshold.

In some embodiments, in the first and second protection modes, the power device is in a soft off state, and in the first protection mode the power device does not respond to a switching signal.

In some embodiments, the second determined time period during which the first protection mode continues is set by the user.

In some embodiments, the method further includes reporting an error to the system host when the power device current is greater than or equal to the first threshold.

The present application also provides an electrical equipment, including one or more power devices; and One or more of the driving devices coupled to the corresponding power devices to provide driving signals to the power devices.

Using the technical solution provided by the present application, after the power device is stably turned on, it can accurately, effectively, and timely prevent the power device from being damaged due to overcurrent, overvoltage, or other factors.

BRIEF DESCRIPTION OF THE DRAWINGS

Embodiments are shown and explained with reference to the drawings. These drawings are used to clarify the basic principles and thus show only the aspects necessary for understanding the basic principles. These drawings are not to scale. In the drawings, the same reference numerals indicate similar features.

FIG. 5 is a timing diagram of the power device driving apparatus in FIG. 3a.

DETAILED DESCRIPTION

In the following detailed description of preferred embodiments, reference will be made to the accompanying drawings that form a part of this application. The accompanying drawings show by way of example specific embodiments that can implement the present application. The exemplary embodiments are not intended to exhaust all embodiments covered by the present application. It can be understood that, without departing from the scope of the present application, other embodiments may be used, and structural or logical modifications may also be made. Therefore, the scope of the present application is limited to the exemplary embodiments described but is defined by the appended claims.

Techniques, methods, and equipment known to those of ordinary skill in the related art may not be discussed in detail, but where appropriate, the techniques, methods, and equipment should be considered as part of the specification. The connection between the blocks in the drawing is only for the convenience of description, which means that the units at both ends of the connection are in communication with each other and is not intended to restrict the unconnected units from communicating.

In the following detailed description, reference may be made to the drawings of each specification that are part of this application to illustrate specific embodiments of this application. In the drawings, similar reference numbers describe substantially similar components in different drawings. Each specific embodiment of the present application is described in enough detail below so that a person of ordinary skill with relevant knowledge and technology in the art can implement the technical solution of the present application. It is understood that other embodiments or structural, logical, or electrical changes to the embodiments of the present application may also be used.

When a power device, such as an IGBT, a SiC based MOSFET or bipolar junction transistor, or a SiC based power module, is turned off due to excessive current load, e.g., a short-circuit, if the driving strength of the normal turn-off is adopted, the $V_{CE}$ may be excessively large, thereby damaging the power device. Therefore, when turning off an overcurrent power device, soft turn-off is generally adopted, which reduces the driving voltage of a power device, such as an IGBT transistor or a SiC MOSFET, slower than normal turn-off to reduce the potential overshoot voltage of the $V_{CE}$. The system or user can set a waiting time after the power device is softly turned off as needed to dissipate the heat generated by the overcurrent or wait for the cause of the overcurrent to disappear. During this waiting time, the overcurrent power device will not be turned on. After this waiting time, the power device resumes normal operation. When the load is short-circuited, the power device generally enters the saturation working area. This protection method of entering soft shutdown and waiting for a time period is called desaturation protection (DESAT).

In addition to extreme load short-circuit conditions, power devices also need to withstand some normal load overcurrent conditions, such as motor start-up, braking, etc. However, if a unified protection mechanism is adopted, a soft shutdown will take place whenever an overcurrent occurs and wait for a time period before the power device responds to the system switching signal PWM again. As such, the working time of the power device will be unnecessarily shortened, thereby reducing the working efficiency of power devices.

This disclosure provides dual-mode overcurrent protection techniques. It can not only play a protective role when the load is short-circuited, but also distinguish the general overcurrent situation, and implement the soft shutdown of the power device to avoid the overvoltage damage of the power device. In short, it first determines whether it is a load short-circuit overcurrent or a general overcurrent; in the case of a load short-circuit overcurrent, the DESAT protection mode is applied, which includes soft shutdown and waiting time, and the switching signal PWM is not responded within the waiting time, and it can also report errors to the system host; under general overcurrent conditions, the overcurrent protection mode is applied, which includes only soft shutdown. There will be no waiting time in the DESAT protection mode, and the PWM signal will not be blanked. In addition, since the on-current is different under the two overcurrent conditions, the system can use different driving capabilities to adjust the degree of soft turn-off.

Figure 1:
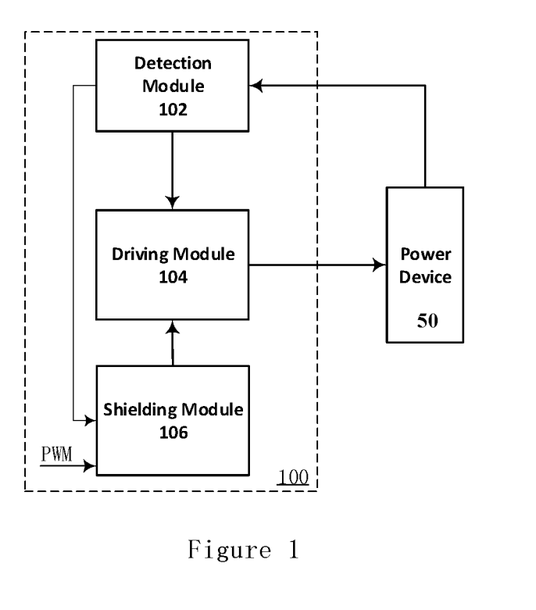
FIG. 1 is a structural diagram of a driving device according to some embodiments of the present application.

FIG. 1 is a structural diagram of a driving device according to some embodiments of the present application.

As shown, the driving apparatus 100 is coupled to a power device 50 to provide a driving signal to the power device 50. The power device 50 may be an IGBT, a SiC MOSFET, a SiC BJT or a SiC based power module. According to some embodiments, the driving device 100 may include a detection module 102 and a driving module 104. The detection module 102 may be used to detect the overcurrent state of the power device 50 to generate a corresponding state flag signal based on the state of the power device and provide the state flag signal to the drive module 104. Based on the above configuration, the driving module 104 can drive the power device 50 based on the state flag signal from the detection module 102 and the pulse width modulation (Pulse Width Modulation, PWM) signal provided by the system.

According to some embodiments, optionally, the driving apparatus 100 may further include a switching signal shielding module 106 for supporting the shielding of the switching signal PWM in some protection modes in the embodiments of the present application, so that the power device cannot switch in response. In addition, according to some embodiments, the shielding module 106 may also be configured to report an error to the system host after receiving the report of the detection module 102 on the overcurrent of the power device 50.

In the following descriptions, an IGBT is used as an example of the power device 50 for illustrative purposes. It appreciated that the descriptions are similarly applicable to other power devices such a SiC MOSFET. The current sense signal is the voltage $V_{CE}$ of the IGBT transistor as an example. Of course, those skilled in the art can understand that the solution in this application can also be applied to other types of power devices or other current sense signals.

Figure 2A:
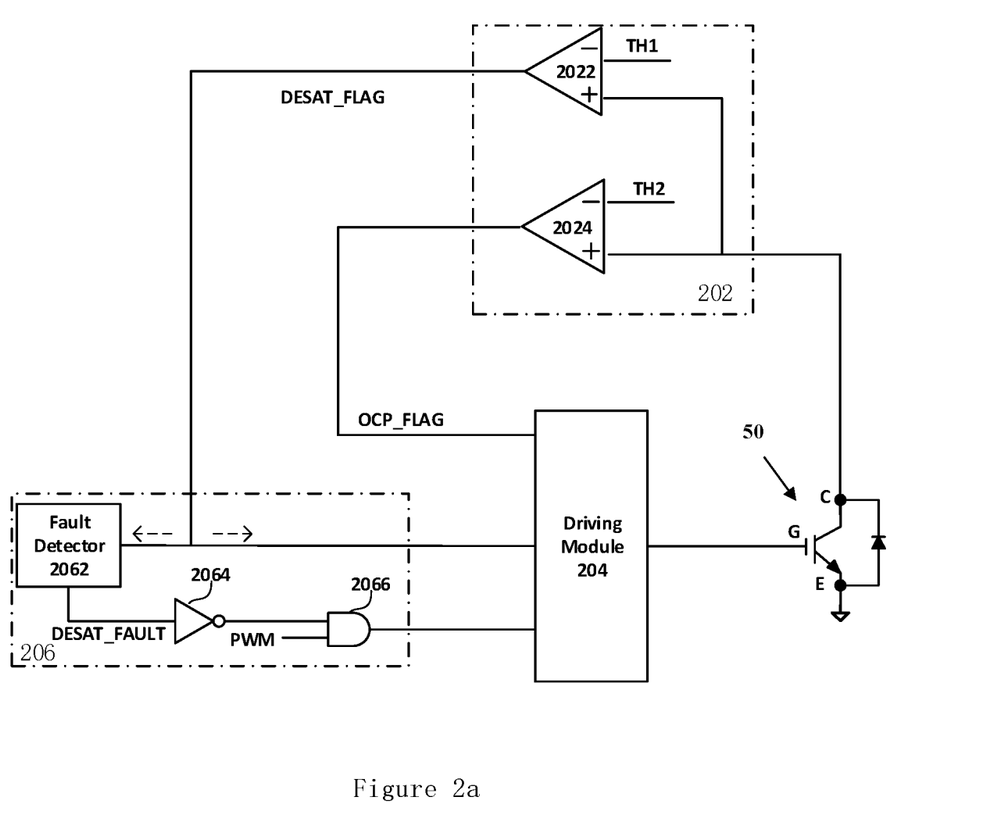
FIG. 2a is a circuit schematic diagram of a power device driving apparatus based on some embodiments of the present application.

FIG. 2a is a schematic circuit diagram of a driving device based on some embodiments of the present application. As shown, the driving apparatus 200 may include a driving module 204, which is coupled to the gate G of a power device 50 such as an IGBT transistor or a Sic MOSFET to provide a driving signal to the power device 50. According to some embodiments, the driving device 200 may further include a detection module 202 and a switch signal shielding module 206.

According to some embodiments, the detection module 202 may include two comparators 2022 and 2024, the first input terminal of the two comparators 2022, 2024, for example, the positive input terminals of the comparators 2022, 2024 are coupled to the collector terminal C of the IGBT transistor 50 to receive the signal $V_{CE}$, the second input terminal, for example, the negative input terminals of the comparators 2022, 2024 are coupled to receive the first threshold voltage $V_{TH1}$ or the second threshold voltage $V_{TH2}$, respectively. According to some embodiments, the first threshold voltage VTH1 may correspond to a voltage value that triggers desaturation protection, such as a value in the load short-circuit voltage range, and the second threshold voltage $V_{TH2}$ may correspond to a voltage value that triggers general overcurrent protection, such as a value in the general overcurrent range. $V_{TH1}$ is typically greater than $V_{TH2}$.

According to some embodiments, the switch signal shielding module 206 may include a fault detector 2062, a NOT gate 2064, and an AND gate 2066. According to some embodiments, the input terminal of the error reporter 2062 is coupled to receive the comparison result of the comparator 2022 such as DESAT_FLAG, and error reporter 2062 generates and outputs the first state flag signal DESAT_FAULT based on the comparison result. According to some embodiments, the output of the error reporter 2062 is coupled to the first input of the AND gate 2066 via the NOT gate 2064. According to some embodiments, the second input of the AND gate 2066 may be coupled to receive the system switching signal PWM.

According to some embodiments, when DESAT_FLAG signal is asserted, e.g., in a positive or active logic level, it means that $V_{CE}$ is greater than or equal to $V_{TH1}$, and the output signal DESAT_FAULT generated by the fault detector 2062 is also asserted, e.g., in a positive or active logic level. In this case, the output of the NOT gate 2064 is de-asserted, e.g., in a negative or inactive logic level, and the signal received at the first input of the AND gate 2066 is also de-asserted. Regardless of the logic level of the PWM signal, the output of the AND gate 2066 is de-asserted, which means that when the DESAT_FLAG flag is asserted, the signal DESAT_FAULT or the output of the fault detector 2062 prevent the PWM signal from reaching the driving module 204, so that the power device 50 cannot respond to the PWM signal through the driving module 204.

According to some embodiments, when VCE is greater than or equal to VTH2, the output OCP_FLAG of the comparator 2024 is asserted, e.g., in a logically positive or active level.

According to some embodiments, a first input of the driving module 204 is coupled to the output of the comparator 2022 and is configured to receive the DESAT_FLAG state flag signal. A second input terminal of the driving module 204 is coupled to the output terminal of the comparator 2024 and is configured to receive the second state flag signal OCP_FLAG. A third input terminal of the driving module 204 is coupled to the output terminal of the switching signal shielding module 206.

According to some embodiments, the driving module 204 controls the driving signal of the power device 50 according to the logic levels of DESAT_FLAG and OCP_FLAG signals. For example, when at least one of the DESAT_FLAG or the OCP_FLAG signal is asserted, the driving module 204 is configured to softly turn off the power device.

According to some embodiments, in the case where OCP_FLAG is asserted and the DESAT_FLAG is not asserted, the signal received at the first input of the AND gate 2066 is asserted and the PWM signal, if asserted, reaches the third input terminal of the driving module 204.

As such, the driving module 204 operates to turn off the power device 50 softly and keep responsive to the PWM signal, e.g., to keep the response to the next PWM turn on request.

Figure 2B:
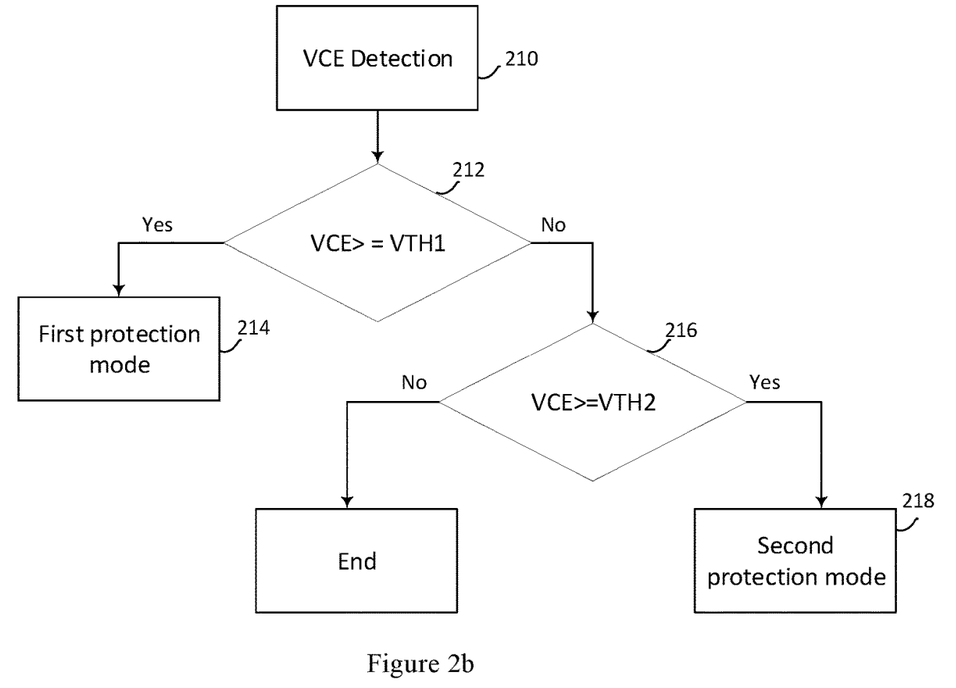
FIG. 2b is a flowchart of a power device driving method based on some embodiments of the present application.

FIG. 2b is a flowchart of a power device driving method according to some embodiments of the present application.

According to some embodiments, in step 210, an overcurrent state of the power device is detected, for example, a current sense signal of the power device such as the $V_{CE}$ of the IGBT transistor 50 may be detected.

In step 212, the current sense signal of the power device 50, such as $V_{CE}$, is compared to $V_{TH1}$ to determine whether the power device is in the first overcurrent state, such as a load short-circuit overcurrent state, $V_{TH1}$ corresponds to a short load $V_{CE}$ level for the conducting current.

If $V_{CE}$ is greater than or equal to $V_{TH1}$, in step 214, the power device may be put into the first protection mode, or desaturation protection mode. According to some embodiments, in this mode, during the second determined time period, the power device remains in the soft off state and does not respond to the switching signal PWM.

If $V_{CE}$ is less than $V_{TH1}$, in step 216, the relationship between $V_{CE}$ and $V_{TH2}$ may be compared to determine whether the power device is in a second overcurrent state, such as a general overcurrent state, $V_{TH2}$ may correspond to a value of VCE under general overcurrent conditions Level. $V_{TH1}$ is greater than $V_{TH2}$.

If $V_{CE}$ is greater than or equal to $V_{TH2}$, in step 218, the power device may be put into the second protection mode, or the general overcurrent protection mode. According to some embodiments, in this mode, the power device 50 is in a soft-off state and can still respond to the switching signal PWM.

If $V_{CE}$ is less than $V_{TH2}$, it means that the power device 50 does not have an overcurrent condition, and the power device 50 is driven to work normally in accordance with the switching signal PWM.

Figure 3A:
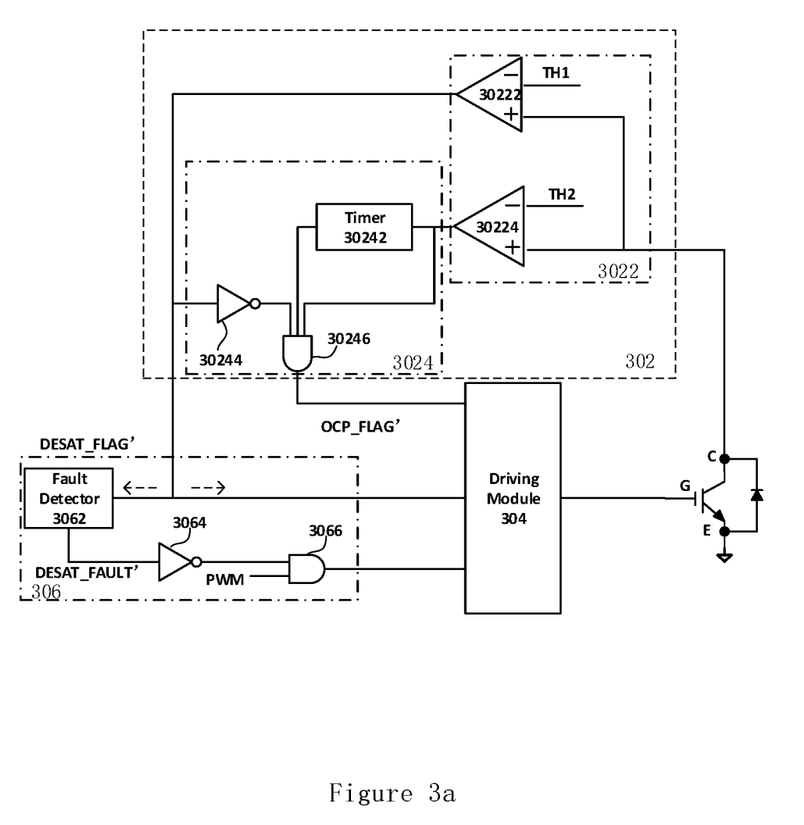
FIG. 3a is a circuit schematic diagram of a power device driving apparatus based on another embodiment of the present application.

FIG. 3a is a schematic circuit diagram of a power device driving device according to another embodiment of the present application. Similarly, the driving device also includes a driving module 304 and a switch shielding module 306, the structure and working principle of which are similar to the corresponding modules in FIG. 2 and will not be repeated here. Only the detection module 302 is described here.

According to some embodiments, the detection module 302 includes a comparison unit 3022 and a delay unit 3024 coupled to each other. The comparison unit 3022 may include comparators 30222 and 30224, the first input terminals of the two comparators 30222, 30224, e.g., the positive input terminal, are both coupled to the collection terminal C of the IGBT transistor 50 to receive the signal $V_{CE}$, and the second input terminals, e.g., the negative input terminals of the two comparators 30222, 30224 are coupled to receive the first threshold voltage $V_{TH1}$ or the second threshold voltage $V_{TH2}$, respectively. According to some embodiments, the first threshold voltage $V_{TH1}$ may correspond to a voltage value that triggers desaturation protection, such as a value in the load short-circuit voltage range, and the second threshold voltage $V_{TH2}$ may correspond to a voltage value that triggers an general overcurrent protection. $V_{TH1}$ is greater than $V_{TH2}$. According to some embodiments, the output signal of the comparator 30222 may be directly provided as the first overcurrent state flag DESAT_FLAG' to the switching signal shielding module 306 and the driving module 304, respectively.

According to some embodiments, the first input terminal and the second input terminal of the delay unit 3024 are respectively coupled to the output terminals of the comparator 30222 and the comparator 30224, and the output terminal of the delay unit 3024 is coupled to the driving module 304 to provide the second overcurrent state flag OCP_FLAG'.

According to some embodiments, the delay unit 3024 may include a timer 30242, a NOT gate 30244, and an AND gate 30246. According to some embodiments, the output of the comparator 30222 is coupled to the first input of the AND gate 30246 via the NOT gate 30244, and the timer 30242 is coupled between the output of the comparator 30224 and the second input of the AND gate 30246. The output of the device 30224 is also directly coupled to the third input of the AND gate 30246. According to some embodiments, output of the timer 30242 is asserted at the end of a determined first time period, which is predetermined, experimentally determined or dynamically determined.

According to some embodiments, the output of the AND gate 30246 is coupled to the drive module 304 to provide the state flag OCP_FLAG'. In some embodiments, the state flag is asserted when the signal is high.

According to some embodiments, the driving module 304 may determine the driving signal output to the IGBT transistor based on the two state flag signals DESAT_FLAG' and OCP_FLAG'.

According to some embodiments, the switching signal shielding unit 306 operates to control whether to shield the switching signal PWM according to at least DESAT_FLAG', so that the IGBT transistor does not react to the PWM signal. For example, in response to the DESAT_FLAG' signal is asserted, the PWM signal does not reach the driving module 304.

According to some embodiments, the driving module 304 may include a timer (not shown for simplicity) to keep the power device softly turned off for a determined second time period, and for example, the shielding module 306 may also include a timer (not shown for simplicity) so that the PWM signal is shielded for a determined third time period, so that the power device does not respond to the PWM signal for the determined third time period. According to some embodiments, the third time period and the second time period are equal to one another and are in a range of 0.5-20 milliseconds. The second time period and the third time period are referred to as the second time period when they are equal to one another.

According to some embodiments, the determined second time period or the waiting period of the power device 50 can be customized according to the needs of the user, for example, the user may wish to wait for the power device 50 to cool down to a normal level or wait for the cause of short circuit to go away.

According to some embodiments, a voltage adjustment unit (not shown) may be coupled between the collector terminal of the IGBT transistor 50 and the comparison unit 3022, configured to condition and scale the signal VCE.

The following describes the process of generating the first state flag signal DESAT_FLAG' and the second state flag signal OCP_FLAG' and the corresponding operation of the driving module 304. It can be understood that the two state flags are generated when the PWM signal is at logic-high level.

(1) VCE<VTH2

When the current sense signal VCE is less than $V_{TH2}$, the output of the comparator 30222 is de-asserted, the first state flag signal DESAT_FLAG' is de-asserted, the output of NOT gate 30244 is thus asserted; the output of the comparator 30224 is also de-asserted, so that the third input of the AND gate 30246 in the delay unit 3024 receives a logic-level signal, therefore, the second state flag OCP_FLAG' is de-asserted. The driving module 304 outputs a normal driving signal to the power device.

(2) $V_{TH2} \leq VCE < V_{TH1}$

When VCE is greater than or equal to VTH2 and less than $V_{TH1}$, the output of the comparator 30222 is de-asserted, the first state flag signal DESAT_FLAG' is de-asserted, the output of the comparator 30224 is asserted, so that the third input of the AND gate 30246 in the delay unit 3024 receives a logic high signal, the second state flag signal OCP_FLAG' thus depends on the output signal logics of the timer 30242 in the delay unit 3024.

According to some embodiments, a first time period is established by the output of the timer 30242, for example, when the output of the comparator 30224 is asserted, the timer 30242 starts, and after the timer expires, the output of the timer is asserted. In the first time period, once $V_{CE}$ is greater than or equal to $V_{TH1}$, the DESAT protection mode is triggered (soft-off of the IGBT transistor, and at the same time does not respond to the PWM signal within a certain time), the first state flag signal DESAT_FLAG' is asserted; if at the end of the determined first time period, $V_{CE}$ is still greater than or equal to $V_{TH2}$ and less than $V_{TH1}$, then it trigger the overcurrent protection mode (soft turn off the IGBT transistor, and the IGBT still responds to the PWM signal). According to some embodiments, the first determined time period established by the timer may be 0.5-20 microseconds. Of course, this determined first time period can be formulated and adjusted according to the needs of the user.

(3) VCE≥VTH1

When $V_{CE}$ is greater than or equal to $V_{TH1}$, the output of the comparator 30222 is asserted, so the first state flag signal DESAT_FLAG' is asserted, and passes through the AND gate 30246 in the action delay unit 3024 of the NOT gate 30244 The first input of the receiver receives a low level; the output of the comparator 30224 is asserted, and the third input of the AND gate 30246 in the delay unit 3024 receives a logic-high signal, so the second state flag signal OCP_FLAG' is de-asserted. In this state, the DESAT protection mode is triggered, and the driving module 304 turns off the power device softly. According to some embodiments, in the DESAT protection mode, the power device does not respond to the PWM signal for a second time period. When the second time period ends, the IGBT transistors will start to respond to the PWM signal.

Figure 4:
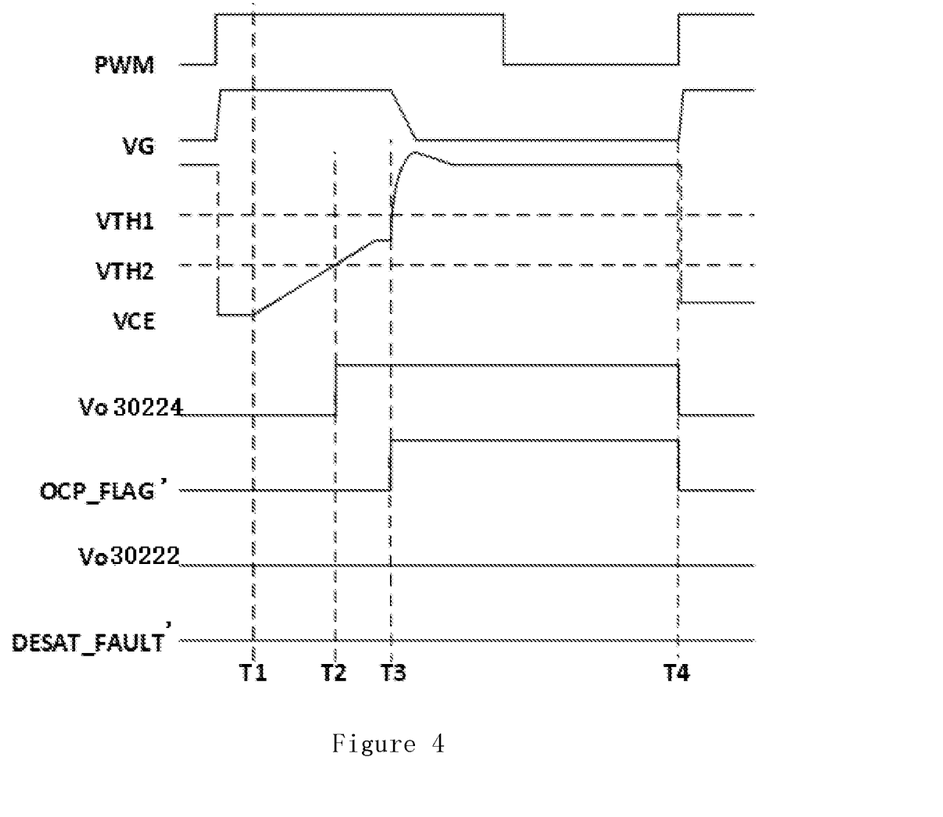
FIG. 4 is a timing diagram of the power device driving apparatus in FIG. 3a during the process of triggering the general overcurrent protection mode.

FIG. 4 is a timing diagram of the driving device in FIG. 3a triggering a general overcurrent protection process.

(1) T1-T2 Period

Since time T1, $V_{CE}$ gradually rises. In this period, $V_{CE}$ is always less than $V_{TH2}$, so the output signals Vo30222 and Vo30224 of the comparators 30222 and 30224 are both de-asserted. Both the first state flag signal DESAT_FLAG' and the second state flag signal OCP_FLAG' are de-asserted.

(2) T2-T3 Period

In this period, $V_{CE}$ is greater than or equal to $V_{TH2}$. Therefore, the output signal Vo30224 of the comparator 30224 is asserted. As described before, the logic level of the second state flag signal OCP_FLAG' at this time is determined by the timer 30242. In this embodiment, the output of the timer 30242 is asserted after a specified first time period (i.e., the time period between T2 and T3). Since $V_{TH2} < V_{CE} < V_{TH1}$ in this period, at the end of the timer 30242 (that is, at T3), OCP_FLAG' is asserted and triggers the soft turn-off of the IGBT transistor and the power device enters into the general overcurrent protection mode.

(3) T3-T4 Period

In this period, since the driving module 304 performs soft turn-off of the IGBT transistor, the gate voltage $V_G$ of the IGBT transistor starts to decrease at the soft turn-off rate at time T3. The IGBT transistor will stay off during the remaining of the PWM cycle but responds to the arrival of the next PWM rising edge.

(4) Time Period after T4

At time T4, the drive module 304 receives a new PWM rising edge level, and then generates a drive signal to the IGBT transistor, so that the IGBT transistor restarts normal operation. It can be seen from the figure that the gate voltage $V_G$ of the IGBT transistor is pulled up to a high potential, and $V_{CE}$ returns to the normal voltage before time T1. Therefore, the output signal Vo30224 of the comparator 30224 is de-asserted.

Figure 5:
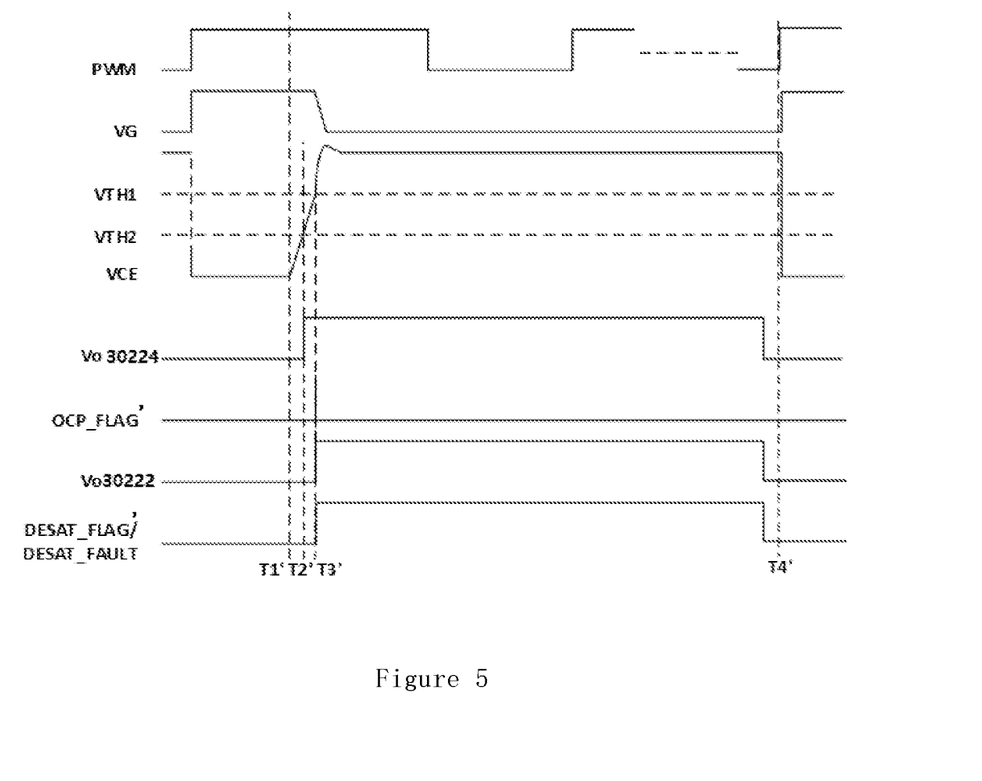

FIG. 5 is a timing diagram based on the drive device in FIG. 3a in the process of triggering a DESAT protection.

(1) T1'-T2' Period

Since time T1', $V_{CE}$ gradually rises. During this period, $V_{CE}$ is less than $V_{TH2}$, so DESAT_FLAG' and OCP_FLAG' are both de-asserted.

(2) T2'-T3' Period

In this period, $V_{CE}$ has risen to $V_{TH2}$ at time T2', so Vo30224 is asserted at time T2'. However, during this time, VCE continues to rise and rapidly rises to reach a level greater than or equal to $V_{TH1}$ by time T3'. Therefore, the output signal of the comparator 30222, that is, DESAT_FLAG' is asserted at time T3'. According to some embodiments, at this time, the first time period generated by the timer 30242 has not ended, so the overcurrent protection signal OCP_FLAG' is still de-asserted.

(3) T3'-T4' Period

In this period, $V_{CE}$ is always equal to or greater than $V_{TH1}$, the first state flag signal DESAT_FLAG' is asserted, and the fault flag DESAT_FAULT' from the fault detector 3062 is asserted at T3'. At this time, based on the DESAT_FLAG' signal received by the driving module 304, the IGBT transistor is softly turned off at time T3'. Since DESAT_FAULT' is asserted, the fault detector 3062 uses DESAT_FAULT' to shield the PWM signal through an AND gate 3066, and the IGBT transistor cannot respond to the PWM signal during this period. According to some embodiments, the user or the system may set DESAT_FLAG' to logic high, and then shield the input PWM signal within a second time period, and the IGBT transistor is in a soft turn-off within this determined second time period.

(4) Period After T4'

At time T4', the determined second time period for keeping the IGBT in the soft-off state has ended, the power device returns to responding to the PWM signal.

From the above, during the rise of $V_{CE}$, if $V_{CE}$ is always greater than $V_{TH2}$ and less than $V_{TH1}$ in the first determined time period counted by timer 30242, at the end of timer 30242, OCP_FLAG' is asserted and the IGBT transistor enters the general overcurrent protection mode; if $V_{CE}$ is greater than or equal to $V_{TH1}$ in the first time period counted by the timer 30242, it does not wait until the timer 30242 ends, DESAT_FLAG' is asserted promptly, the IGBT transistor enters desaturation protection mode.

It can be understood that the lengths of time defined by the reference potentials $V_{TH1}$, $V_{TH2}$ and the timer 30242 can be adjusted according to different specific applications. For example, the first threshold voltage $V_{TH1}$ may be between 7-10V, the second threshold voltage $V_{TH2}$ may be greater than the collector-emitter voltage at which the power device such as an IGBT transistor conducts the maximum current, and $V_{CE}$ may be selectively considered with temperature change.

Figure 3B:
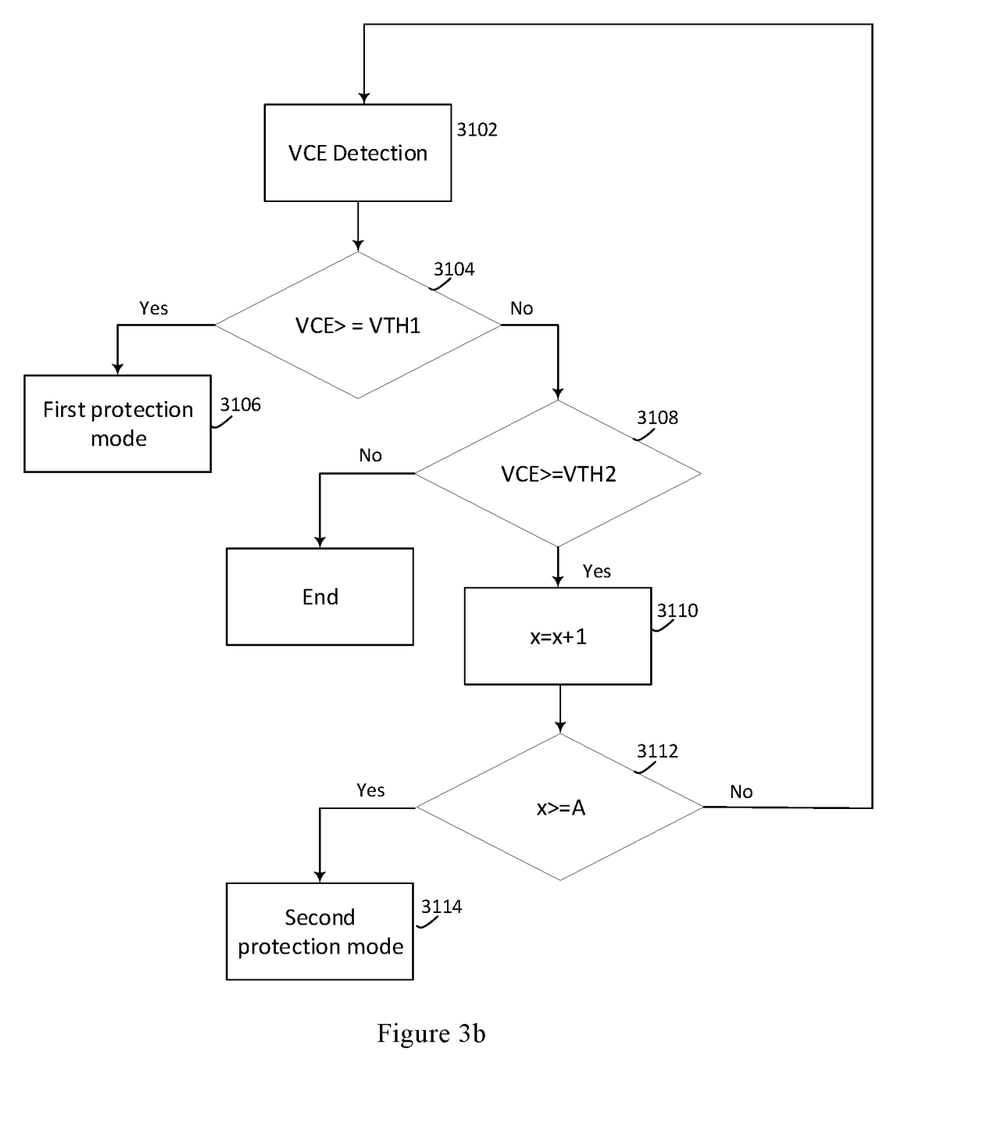
FIG. 3b is a flowchart of a driving method of a power device based on another embodiment of the present application.

FIG. 3b is a flowchart of a power transistor driving method according to some embodiments of the present application.

According to some embodiments, in step 3102, a signal representing the state of the power device, such as the $V_{CE}$ of the IGBT transistor, may be detected.

In step 3104, the signal representing the overcurrent state of the power device, such as the relationship between the $V_{CE}$ and $V_{TH1}$ of the IGBT transistor, can be compared to determine whether the power device is in the first overcurrent state, i.e. a load short circuit overcurrent state.

If $V_{CE}$ is greater than or equal to $V_{TH1}$, in step 3106, the power device is put into the first protection mode, or DESAT protection mode. According to some embodiments, in this mode, the power device remains in the soft-off state for a determined second time period and does not respond to the switching signal PWM.

If $V_{CE}$ is less than $V_{TH1}$, in step 3108, the relationship between $V_{CE}$ and VTH2 may be compared to determine whether the power device is in the second overcurrent state, such as a general overcurrent state, $V_{TH1}$ is greater than $V_{TH2}$.

If $V_{CE}$ is less than $V_{TH2}$, it means that there is no overcurrent condition in the power device, and the power transistor is driven to work normally in accordance with the switching signal PWM.

If $V_{CE}$ is greater than or equal to $V_{TH2}$, in step 3110, let x=x+1, where x may be an integer greater than or equal to 0.

At step 3112, it is determined whether x is greater than or equal to a threshold value A. This threshold value A may correspond to the length of the prescribed time period of the timer 30242.

If x is less than A, return to step 3102 to continue to monitor and compare $V_{CE}$.

If x is greater than or equal to A, in step 3114, the power device may be put into the second protection mode, or the general overcurrent protection mode. According to some embodiments, in this mode, the power device is in a soft-off state and can still respond to the switching signal PWM.

According to different embodiments, the overcurrent state of the power device may be reflected by different parameters. For example, it can be assumed that the on-resistance of the power device is a fixed value, and then the overcurrent state of the power device can be understood by detecting the $V_{CE}$ of the power device such as the IGBT transistor. Of course, for other power devices, a current level detection device may be provided. For such a power device, the overcurrent state can be judged by directly detecting the level of its current. The method and apparatus provided by the present application are not only applicable to the case where $V_{CE}$ is used to reflect the overcurrent state, but also applicable to the case where other indicators are used to reflect the overcurrent state of the power device. That is to say, the threshold corresponding to the current sense method of the power device in this application may be voltage, current, and so on.

The circuit and method described in this embodiment can not only distinguish between the general overcurrent and desaturation overcurrent conditions, to select the corresponding protection mode in a targeted manner, and extend the monitoring time. After a general over-current phenomenon exists, continue to monitor for a time period. If a desaturation over-current phenomenon occurs, take corresponding protective measures immediately. Since the probability of desaturation over-current occurs after a general over-current phenomenon occurs, the solution in this embodiment can more accurately capture the de-saturation over-current phenomenon in time and provide timely and effective protection to the power device.

Therefore, although the present application has been described with reference to specific examples, which are intended to be exemplary only, and not to limit the present application, it is obvious to those of ordinary skill in the art that The disclosed embodiments may be changed, added, or deleted without departing from the spirit and scope of protection of this application.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments considering the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driving device, including:
   a detection module, configured to be coupled to a power device to detect an overcurrent status of the power device; and
   a driving module, configured to be respectively coupled to the detection module and the power device to regulate the power device according to a detection result of the detection module,
   wherein, in response to the detection result indicating that the power device is in a first overcurrent state, the drive module is configured to cause the power device to softly turn off and not to respond to a system switching signal;
   wherein in response to the detection result indicating that the power device is in a second overcurrent state, the drive module is configured to cause the power device to softly turn off and be responsive to the system switching signal; and
   wherein the first overcurrent state corresponds to a higher overcurrent value than the second overcurrent state.

2. The driving device according to claim 1, further comprising a switching signal shielding module, coupled between the detection module and the driving module, and configured to shield the system switching signal in response to the detection result of the detection module indicating that the power device is in the first overcurrent state.

3. The driving device according to claim 1, wherein the detection module includes a first comparator and a second comparator, the first comparator coupled to compare a first threshold value with a first signal of the power device that is related to the overcurrent status of the power device, and the second comparator coupled to compare a second threshold value with the first signal.

4. The driving device of claim 3, wherein the first threshold value is greater than the second threshold value.

5. A device, including:
a detection module, coupled with a power device, and configured to detect an overcurrent status of the power device;
a driving module, respectively coupled to the detection module and the power device, and configured to regulate the power device according to a detection result of the detection module,
wherein:
in response to the detection result indicating that the power device is in a first overcurrent state, the driving module is configured to cause the power device to enter a first protection mode;
in response to the detection result indicating that the power device is in a second overcurrent state, the detection module continues to detect the overcurrent status of the power device within a first determined time period;
during the first determined time period, in response to that the power device reaches the first overcurrent state, the driving module is configured to cause the power device to enter the first protection mode; and
in response to the power device remaining in the second overcurrent state at an end of the first determined time period, the driving module is configured to cause the power device to enter a second protection mode, and
wherein the detection module comprises:
a first comparator having a first input terrain& configured to receive a first threshold value, a second input terminal configured to receive a current sense signal of the power device, and an output terminal coupled to the driving module to provide a first overcurrent state flag;
a second comparator having a first input terminal configured to receive a second threshold, a second input configured to receive the current sense signal of the power device, the first threshold being greater than the second threshold; and
a delay unit having a first input terminal and a second input terminal respectively coupled to output terminals of the first comparator and the second comparator, and configured to generate the first determined time period and a second state flag signal based on the output signals of the first comparator and the second comparator within or at the end of the first determined time period.

6. The device according to claim 5, further comprising a switching signal shielding module, coupled between the detection module and the driving module, and configured to shield a system switching signal in response to the detection result indicating that the power device is in the first overcurrent state.

7. The device of claim 5, wherein the delay unit comprises:
a timer device having an input terminal coupled to the output terminal of the second comparator, and configured to start a timer operation when the output signal of the second comparator is asserted, and generate an asserted signal at an output terminal of the timer device after the timer operation expires;
a NOT gate having an input terminal coupled to the output of the first comparator; and
an AND gate having a first input terminal coupled to an output terminal of the NOT gate, a second input terminal coupled to the output terminal of the timer device, a third input terminal coupled to the output terminal of the second comparator, and an output terminal coupled to the driving module to provide the second state flag signal to the driving module.

8. The device of claim 6, wherein the switching signal shielding module comprises:
a fault detector configured to, in response to the detection result indicating that the power device is in the first overcurrent state, block the system switching signal from reaching to the driving module.

9. The device of claim 8, wherein the fault detector reports an error to a system host in response to the detection result indicating that the power device is in the first overcurrent state.

10. The device of claim 5, further comprising:
an adjustment module coupled between the power device and the detection module to generate a current sense signal of the power device; and
wherein the detection module detects the overcurrent status of the power device based on the current sense signal.

11. The device of claim 5, further comprising the power device.

12. A driving method, including:
detecting a current sensing signal related to an overcurrent status of a power device;
in response to the current sense signal being greater than or equal to a first threshold, driving the power device under a first protection mode to cause the power device to softly turn off and not to respond to a system switching signal, the first threshold corresponding to a first overcurrent state; and
in response to the current sense signal being greater than or equal to a second threshold and less than the first threshold, driving the power device under a second protection mode to cause the power device to softly turn off and be responsive to the system switching signal, the second threshold corresponding to a second overcurrent state.

13. The method of claim 12, wherein in the first protection mode, the power device is shielded from the system switching signal.

14. The method of claim 12, wherein in the second protection mode, the power device is not shielded from the system switching signal.

15. A driving method for power devices, including:
detecting a current sensing signal related to an overcurrent status of a power device;
in response to the current sense signal being greater than or equal to a first threshold, driving the power device under a first protection mode to cause the power device to softly turn off and not to respond to a system switching, signal, the first threshold corresponding to a first overcurrent state;
in response to the current sense signal being greater than or equal to a second threshold and less than the first threshold, monitoring the current sense signal of the power device within a first determined time period, the second threshold corresponding to a second overcurrent state;
during the first determined time period, in response to the current sense signal being greater than or equal to the first threshold, driving the power device under the first protection mode to cause the power device to softly turn off and not to respond to the system switching signal; and at the end of the first determined time period, in response to the current sense signal remaining greater than or equal to the second threshold and less than the first threshold, driving the power device under a second protection mode to cause the power device to softly turn off and be responsive to the system switching signal.

16. The method of claim 15, wherein in the first protection mode, the power device is shielded from the system switching signal.

17. The method of claim 16, wherein the driving the power device under the first protection mode lasts a second time period.

18. The method of claim 15, further comprising reporting an error to a system host in response to the current sense signal being greater than or equal to a first threshold.

19. The method of claim 15, wherein in the second protection mode, the power device is not shielded from the system switching signal.

* * * * *

UNITED STATES PATENT AND TRADEMARK OFFICE
CERTIFICATE OF CORRECTION

| | | |
|---|---|---|
| PATENT NO. | : 11,239,838 B2 | Page 1 of 1 |
| APPLICATION NO. | : 16/865137 | |
| DATED | : February 1, 2022 | |
| INVENTOR(S) | : Jingquan Chen et al. | |

It is certified that error appears in the above-identified patent and that said Letters Patent is hereby corrected as shown below:

In the Claims

<u>Column 13, Claim 5, Line 31:</u>
"input terrain& configured"
Should read:
--input terminal configured--.

Signed and Sealed this
Twenty-first Day of May, 2024

Katherine Kelly Vidal
*Director of the United States Patent and Trademark Office*